United States Patent

Lynch

[15] 3,641,401

[45] Feb. 8, 1972

[54] LEADLESS CERAMIC PACKAGE FOR INTEGRATED CIRCUITS

[72] Inventor: James E. Lynch, Chattanooga, Tenn.

[73] Assignee: American Lava Corporation, Chattanooga, Tenn.

[22] Filed: Mar. 10, 1971

[21] Appl. No.: 123,050

Related U.S. Application Data

[63] Continuation of Ser. No. 843,460, July 22, 1969, abandoned.

[52] U.S. Cl. ....................317/234 R, 317/234 F, 317/234 G, 317/234 N, 174/52, 29/588

[51] Int. Cl. ..........................................H01l 3/00, H01l 5/00

[58] Field of Search ....................317/234, 235, 3, 3.1, 4, 4.1, 317/5.4, 101 AC; 29/472.9, 588

[56] References Cited

UNITED STATES PATENTS

| | | | |
|---|---|---|---|
| 3,372,309 | 3/1968 | Stockdale | 317/234 |
| 3,436,810 | 4/1969 | Kauffman | 317/234 |
| 3,483,308 | 12/1969 | Wakely | 317/234 |
| 3,497,947 | 3/1970 | Ardezzone | 317/234 |
| 3,509,430 | 4/1970 | Mroz | 317/234 |
| 3,589,434 | 4/1970 | Yanai et al | 317/235 |

FOREIGN PATENTS OR APPLICATIONS

| | | | |
|---|---|---|---|
| 1,543,300 | 9/1968 | France | 317/234 |

*Primary Examiner*—John W. Huckert
*Assistant Examiner*—Andrew J. James
*Attorney*—Kinney, Alexander, Sell, Steldt & Delahunt

[57] ABSTRACT

A plug-in leadless package for integrated circuits is provided having integral male contact members supported by ceramic backing. The package is adapted to connection by spring connectors or by soldering in mating female receptacles.

7 Claims, 6 Drawing Figures

INVENTOR.
JAMES E. LYNCH
BY Kinney, Alexander, Sell, Steldt & De La Hunt
ATTORNEYS

LEADLESS CERAMIC PACKAGE FOR INTEGRATED CIRCUITS

This is a continuation of Ser. No. 843,460 filed July 22, 1969, now abandoned.

This invention relates to a ceramic package for integrated circuits circuits which has been simplified in structure so that metallic contact strips are integrally supported on the ceramic itself and the package plugs into a suitable receptacle.

Ceramic packages for integrated circuits have been provided heretofore with multiple leads welded or otherwise bonded to terminals on the ceramic base. Such leads were bent after mounting the integrated circuit and served as male plugs which could be received by an equal multiplicity of female receptacles in a single unit of a large panel, mother board or printed circuit board. A serious disadvantage was that the leads might be inadequately secured and might become disconnected after the unit was otherwise ready or the leads might break or bend when inserted into the female receptacle. Furthermore the attachment of leads and other processing to provide a package with plug-in leads adds significantly to the cost of each item. With packaged integrated circuits being used in large numbers any saving in cost is advantageous. It is particularly the overcoming of this cost disadvantage and avoidance of mounting leads which are objects of this invention.

This invention provides a package unit on a ceramic base having lead from the package unit arranged on and integrally adherent to the base so as to be adapted to being received by a female receptacle containing suitably spaced individual contacting means to contact each of the leads of the package unit. Contact may be by spring engagement or by direct soldering, for example, in a printed circuit board.

The invention is more fully explained by reference to the drawings wherein.

Figure 1:
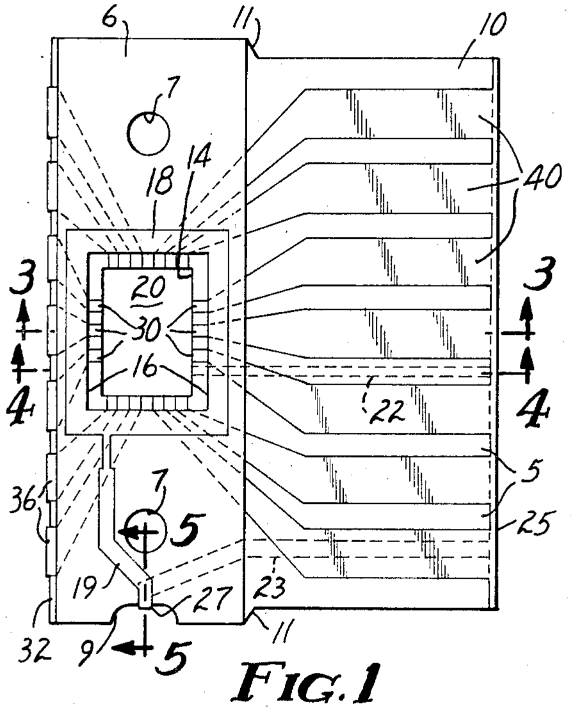
FIG. 1 is a plan view of one surface obverse) of a ceramic package of the invention before removal of a plating connector bar.

In the figures, there is shown a ceramic base 5 having obverse 10 and reverse 12. Ceramic base 5 is essentially two congruent sheets and two strips at the package end all unified by firing. A preferred ceramic is one comprising 80 percent or more and preferably 90 percent or more of $Al_2O_3$. The lines dividing the two sheets and two strips are not shown in cross-sectional views because the ceramic is integrally bonded but they correspond to the level of terminal (or land) 20 and leads 22 and 23 and of integrally adherent obverse and reverse contacts 40. Lands, leads and other metallic parts may be tungsten, molybdenum, manganese, palladium or platinum. Exposed parts are normally goldplated after firing. A plating connector bar 25 is provided connecting these several lands for ease in subsequent electrolytic coating operations. Bar 25 is removed in a later stage of operation, for example, by grinding and is therefore absent in FIGS. 2 and 6.

A cavity 14 is provided in the obverse surface essentially congruent with 59 terminal 20. One ceramic strip 6 is provided on the obverse having an opening 16 surrounding cavity 14 at a sufficient distance so that terminals 30 are exposed for connection to the integrated circuit (not shown) which is to BE MOUNTED IN CAVITY -$ ON TERMINAL 0). Ceramic strip 6 runs lengthwise of the unit and is unified therewith except where leads from terminals 30 pass under it. A ring frame 18 having lead 19 is provided around opening 16 for attachment of a suitable cap for sealing a packaged integrated circuit. The lead 19 is provided to permit electrochemical plating of the ring frame 18.

The ceramic base 5 is provided with two holes 7 which provide means for removal of the unit when plugged into a receptacle in a large panel. Offsets are provided at 11 as means for positioning the unit in a mating receptacle. Notch 9 is provided for convenience in interconnection between leads 23 and 19 which connection can be broken if desired by grinding away the small interconnection 27.

Figure 2:
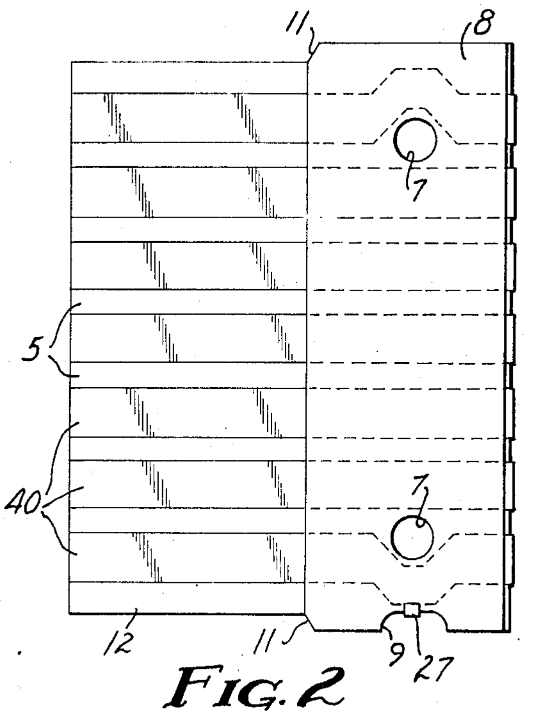
FIG. 2 is a plan view of the other surface (reverse) of a ceramic package of the invention after removal of plating connector bar.
Figure 3:
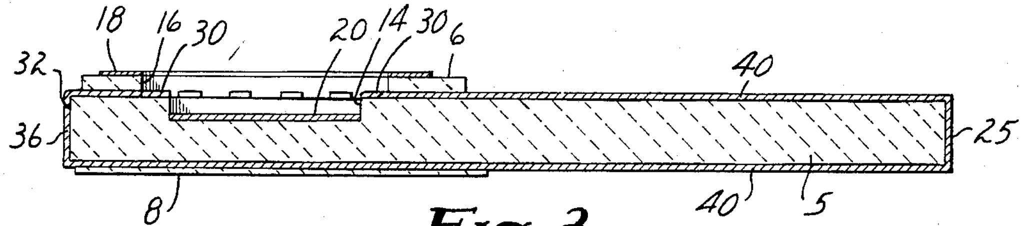
FIG. 3 is a section along line 3—3 of FIG. 1.
Figures 4, 5, 6:
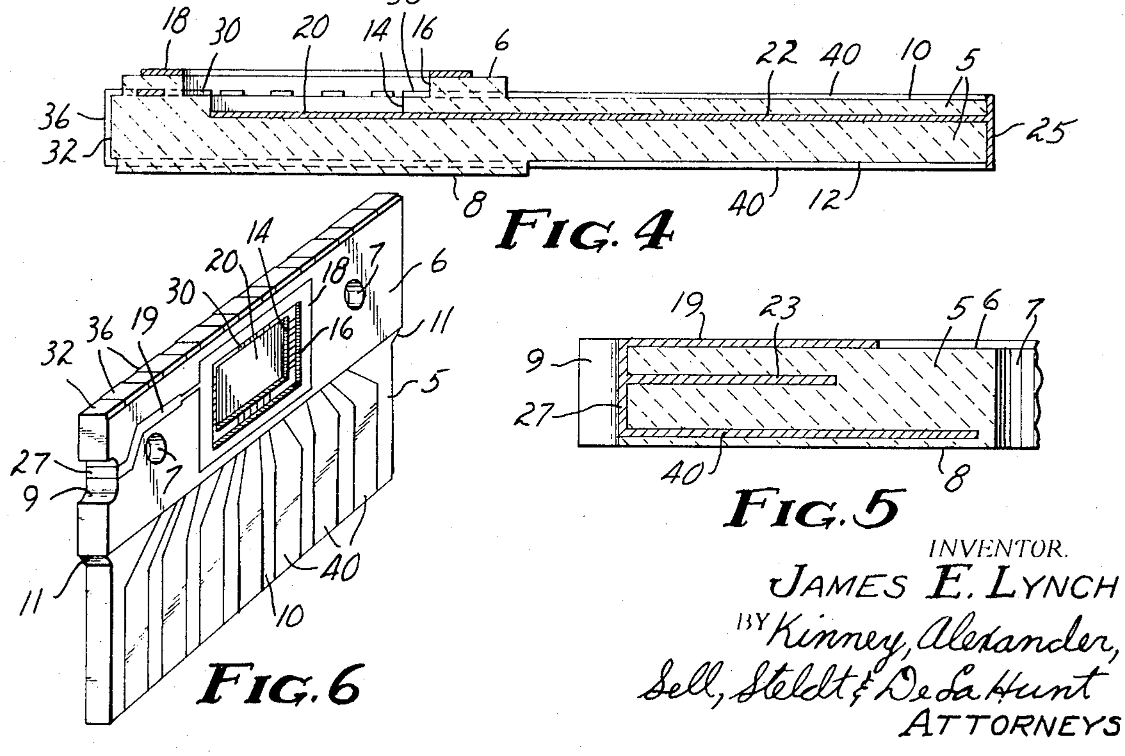
FIG. 4 is a section along line 4—4 of FIG. 1.
FIG. 5 is a section along line 5—5 of FIG. 1. between the edge notch and one hole.
FIG. 6 is a perspective view of a ceramic package of the invention as shown on the reverse in FIG. 2. Concealed lines are shown.

Each of the terminals 30 14 are shown but the number may be more or less) is connected to a contact surface 40 of which seven are on the obverse surface 10 and seven are on the reverse surface 12 in the illustrative unit. It will be evident that the number of such terminals and contact surfaces may be varied and that the disposition thereof, particularly of the contact surfaces, may be arranged for convenience without departing from the scope of the invention. For example, two points of contact may be provided within a single line and in that case suitable variations in the leads etc., will be made. The essence of the invention is that metallic contact surfaces form an integral part of the ceramic package. Buried leads 22 and 23 are provided to effect contact to land 20 and ring frame 18 and they and all contact surfaces are connected by plating connector bar 25 which is removed by grinding away as illustrated in FIGS. 2 and 6 after electroplating is completed.

It will be seen from the drawings that half the terminals 30 are connected around one edge 32 as leads 36 to the contact surfaces 40 on the reverse and the other half are connected to contact surfaces 40 on the obverse. Those skilled in the art will recognize that connection can also be made to the reverse through via holes penetrating the base and by other methods. The upper ends of the leads on the reverse are insulated by application of a thin layer of ceramic 8. Leads 36 are conveniently applied to edge 32 by screening.

An article as shown in the drawings is constructed by assembling and unifying flexible sheets of unfired ceramic of desired composition and dimensions (allowing for shrinkage) on which the appropriate conductive patterns have been screened using a paste of a refractory metal. For example, the ceramic may be of one of the types with organic binder described in Park, U.S. Pat. No. 2,996,719, having about 94 percent $Al_2O_3$ and the refractory metal may be tungsten. It may be desirable to apply the strip 8 on the reverse side as a second operation so that on the first firing the assembly will lie flat. Also leads 36 are applied in a separate operation as is also connecting bar 25.

Many variations in this invention will be apparent to those practicing the art.

What is claimed is:

1. A plug-in ceramic package for an electronic component comprising a ceramic base having upper and lower surfaces and comprising a plug-in part and a component-holding part, said component-holding part having a cavity for receiving an electronic component containing a plurality of metallic terminals for connection to said electronic component, means surrounding said cavity for attaching a cover over said cavity, said plug-in part having a plurality of spaced-apart, relative narrow, exposed parallel metallic contact surfaces adherent to at least one of said upper and lower surfaces of said ceramic base and running from the edge of said plug-in part toward the cavity of said component-holding part, and, metallic leads at least partially buried within said component-holding part of said ceramic base electrically connecting the metallic terminals in said cavity with said parallel metallic contact surfaces.

2. A plug-in ceramic package for an electronic component comprising a ceramic base having a surface comprising two planes, the lower plane forming a plug-in part and the upper forming a component-holding part, said component-holding part having a pad for attachment of an electronic component and having a plurality of metallic terminals for connection to said electronic component, means surrounding said pad and said metallic terminals for attaching a cover thereover, said plug-in part having a plurality of spaced apart, relatively narrow, exposed parallel metallic contact surfaces adherent to at least one of said upper and lower surfaces of said ceramic base and running from the edge of said plug-in part toward said component-holding part, and, metallic leads at least partially buried within said component-holding part of said ceramic base electrically connecting said metallic terminals with said parallel metallic contact surfaces.

3. An integral plug-in ceramic package for an electronic component having a thinner plug-in part and a thicker component-holding part and comprising, a ceramic base having upper and lower surfaces, at least the upper surface being in two planes, thereby forming a thicker side and a thinner side, and edgewise extensions of said base making said sides respectively broader and narrower, a cavity provided with an opening for access to said cavity on the upper surface of said thicker side containing a pad for receiving an electronic component and containing a plurality of metallic terminals for connection to said electronic component, means on said upper surface surrounding said cavity for attaching a cover over said cavity, a plurality of spaced-apart, relatively narrow, parallel metallic contact surfaces adherent to at least one face of said thinner plug-in side of said ceramic base and running from said thicker component-holding side of said ceramic base to the opposite edge of said thinner side, metallic leads at least partially buried within the thicker side of said ceramic base electrically connecting the metallic terminals in said cavity with said parallel metallic contact surfaces.

4. An integral plug-in ceramic package according to claim 3 wherein the lower surface is in two planes and includes metallic contact surfaces and leads are buried within the thicker part.

5. An integral plug-in ceramic package according to claim 3 wherein the ceramic base is alumina.

6. An integral plug-in ceramic package according to claim 3 wherein metallic contact surfaces, metallic terminals and metallic leads therebetween are tungsten, molybdenum, manganese, platinum or palladium.

7. An integral plug-in ceramic package according to claim 6 wherein exposed metallic contact surfaces and terminals are gold plated.

* * * * *

UNITED STATES PATENT OFFICE
CERTIFICATE OF CORRECTION

Patent No. 3,641,401 Dated February 8, 1972

Inventor(s) James E. Lynch

It is certified that error appears in the above-identified patent and that said Letters Patent are hereby corrected as shown below:

Column 1, line 35, "obverse)" should read -- (obverse) --; line 59, "goldplated" should read -- gold plated --; line 65, "with 59 terminal" should read -- with the terminal --; line 69 "BE MOUNTED IN CAVITY -$ ON TERMINAL 0)." should read -- be mounted in cavity 14 on terminal 20 --. Column 2, line 60, "relative" should read -- relatively --.

Signed and sealed this 7th day of November 1972.

(SEAL)
Attest:

EDWARD M.FLETCHER,JR.
Attesting Officer

ROBERT GOTTSCHALK
Commissioner of Patents